US005914211A

United States Patent [19]

Hashino et al.

[11] Patent Number: 5,914,211

[45] Date of Patent: Jun. 22, 1999

[54] PHOTOSENSITIVE LITHOGRAPHIC PRINTING PLATE AND IMAGE-ADDING TYPE LITHOGRAPHIC PRINTING PLATE USING THE SAME

[75] Inventors: Tadashi Hashino; Satoshi Imahashi, both of Ohtsu, Japan

[73] Assignee: Toyo Boseki Kabushiki Kaisha, Osaka, Japan

[21] Appl. No.: 08/875,696

[22] PCT Filed: Nov. 26, 1997

[86] PCT No.: PCT/JP96/03457

§ 371 Date: Aug. 1, 1997

§ 102(e) Date: Aug. 1, 1997

[87] PCT Pub. No.: WO97/20698

PCT Pub. Date: Jun. 12, 1997

[30] Foreign Application Priority Data

| | | | |
|---|---|---|---|
| Dec. 1, 1995 | [JP] | Japan | 7-314296 |
| Dec. 1, 1995 | [JP] | Japan | 7-314297 |
| Dec. 20, 1995 | [JP] | Japan | 7-332354 |
| Dec. 20, 1995 | [JP] | Japan | 7-332357 |
| May 17, 1996 | [JP] | Japan | 8-123261 |
| May 17, 1996 | [JP] | Japan | 8-123265 |

[51] Int. Cl.[6] .......... G03F 7/021; G03F 7/023; G03F 7/11

[52] U.S. Cl. .......... 430/166; 430/271.1; 430/161

[58] Field of Search .......... 430/271.1, 166, 430/161; 428/483, 463, 704, 522

[56] References Cited

U.S. PATENT DOCUMENTS

| | | | |
|---|---|---|---|
| 4,781,985 | 11/1988 | Desjarlais | 428/421 |
| 5,068,140 | 11/1991 | Malhotra et al. | 428/216 |
| 5,073,455 | 12/1991 | Nose et al. | 428/411.1 |
| 5,094,909 | 3/1992 | Tachibana et al. | 428/327 |
| 5,236,796 | 8/1993 | Koyama et al. | 430/58 |
| 5,294,493 | 3/1994 | Beckerbauer et al. | 428/411.1 |
| 5,294,590 | 3/1994 | Egashira et al. | 503/227 |
| 5,300,401 | 4/1994 | Fujikura et al. | 430/271 |
| 5,397,646 | 3/1995 | Nickle et al. | 428/423.1 |
| 5,643,669 | 7/1997 | Tsuei | 428/354 |

FOREIGN PATENT DOCUMENTS

| | | |
|---|---|---|
| 403059644 | 3/1991 | Japan . |
| 7229069 | 8/1995 | Japan . |
| 408234415 | 9/1996 | Japan . |

*Primary Examiner*—Kathleen Duda
*Assistant Examiner*—Jill N. Holloman
*Attorney, Agent, or Firm*—Foley & Lardner

[57] ABSTRACT

A laminated substrate including a substrate and a hydrophilic resin layer formed on the substrate, wherein the hydrophilic layer is one made from a resin composition including a hydrophobic polymer linked to a hydrophilic polymer having acidic groups, salts of acidic groups, basic groups, or salts of basic groups; a photosensitive lithographic printing plate including a substrate and a dampening water receiving layer and a photosensitive layer formed on the substrate successively, wherein the above hydrophilic resin layer is used as the dampening water receiving layer; and an image-adding lithographic printing plate including a substrate and an image-receiving layer formed on the substrate, wherein the above hydrophilic resin layer is used as the image-receiving layer.

12 Claims, No Drawings

PHOTOSENSITIVE LITHOGRAPHIC PRINTING PLATE AND IMAGE-ADDING TYPE LITHOGRAPHIC PRINTING PLATE USING THE SAME

This application is a 371 of PCT/JP96/03457 filed Nov. 26, 1996.

FIELD OF THE INVENTION

The present invention relates to a laminated substrate as well as a photosensitive lithographic printing plate and an image-adding type lithographic printing plate (including laser-printing plate) made each using the same. More particularly, the invention relates to a laminated substrate comprising a substrate and a hydrophilic resin layer of a specific composition formed on the substrate, a photosensitive lithographic printing plate wherein the above hydrophilic resin layer is used as a dampening water receiving layer, and an image-adding type lithographic printing plate wherein the hydrophilic resin layer is used as an image-receiving layer.

Printing using the above plate is free from scumming and image missing during long-run printing and can give prints excellent in resolution.

BACKGROUND OF THE INVENTION

There have been put to practical use and widely used photosensitive lithographic printing plates (PS plates: pre-sensitized printing plates) produced by subjecting the surface of a sheet of a metal (such as aluminum) to grinding, anodization, hydrophilic treatment and so on to produce a substrate and forming a photosensitive layer of a photosensitive diazo resin, photopolymerizable composition or photo-crosslinkable composition on the substrate. Such PS plates are subjected to imagewise exposure and development to thereby remove non-image areas of the photosensitive layer, and then printing is conducted by utilizing the hydrophilicity of the substrate surface in non-image areas and the lipophilicity of the photosensitive layer in image areas.

However, a metal sheet having hydrophilic treatment subjected thereto is disadvantageous in that it is expensive, that the handling of the sheet is restricted owing to the poor flexibility thereof, and that the downsizing of the plate-making equipment is difficult, though the sheet is excellent in strengths necessary for the substrate of a printing plate and in retention of hydrophilicity in printing to attain high durability Further, there have also been known plates produced by forming a hydrophilic resin layer on an inexpensive and flexible substrate such as waterproof paper, plastic film or synthetic paper and forming a photosensitive layer on the hydrophilic resin layer. However, the resin constituting the hydrophilic layer is poor in water resistance owing to its hydrophilicity and therefore is liable to be swollen with a developing solution used in development or with dampening water used in printing. Therefore, printing with such a plate results in poor durability and resolution and suffers from peeling or scumming disadvantageously.

In order to improve the water resistance of the hydrophilic resin, there have been proposed processes of adding a crosslinking agent such as glyoxal, melamine, urea or amino resin to the resin and heating the resulting composition to cure it (see JP-A-51-104902, JP-A-53-141702 and JP-A-57-69097) However, it is very difficult to form a hydrophilic resin layer excellent in both hydrophilicity and water resistance by such a process, because sufficient crosslinking of a hydrophilic resin with importance attached to water resistance gives an insufficiently hydrophilic layer leading to scumming, while slight crosslinking thereof with importance attached to hydrophilicity gives an insufficiently water-resistant layer which is swollen in development or printing to result in poor resolution and to cause scumming. Further, the hydrophilic resin layer is poor in adhesion to a hydrophobic photosensitive layer, so that image missing is liable to occur after development or during printing.

Meanwhile, there have been disclosed processes of forming on a substrate a layer containing a resin (such as maleic anhydride copolymer) which is originally hydrophobic but is converted into a hydrophilic resin during or after alkali development conducted after exposure (see JP-A-57-98395, JP-A-60-90338 and JP-A-60-125699). Such a maleic anhydride copolymer is less hydrophilic than the above hydrophilic resins and therefore is easily applicable on hydrophobic substrates such as plastic films. However, a plate comprising a hydrophilic resin layer containing the maleic anhydride copolymer is swollen in development or printing owing to the poor water resistance of the layer that is made by development to come to the surface in non-image areas, which is causative of poor resolution and scumming. Further, there have been proposed the formation of a layer from a combination of a polyamide resin with a urea resin and a pigment (see JP-A-55-40406) and the formation of a layer from a composition comprising a water-soluble acrylic copolymer and a crosslinking agent (see JP-A-58-14794). However, both layers are poor in adhesion to a photosensitive layer, particularly when the photosensitive layer is a photopolymerizable one which is generally extremely hydrophobic.

SUMMARY OF THE INVENTION

The present invention has been made to overcome the above disadvantages and aims at providing a laminated substrate which is excellent in adhesion to a photosensitive layer, water resistance, and hydrophilicity of non-image areas after alkali development and enables printing free from scumming and image missing to give prints excellent in resolution; and a photosensitive lithographic printing plate and an image-adding type lithographic printing plate each using the same.

Namely, the present invention relates to:

(1) a laminated substrate comprising a substrate and a hydrophilic resin layer formed on the substrate, wherein the hydrophilic resin layer is one made from a resin composition comprising a hydrophobic polymer and a hydrophilic polymer having acidic groups, salts of acidic groups, basic groups or salts of basic groups;

(2) a photosensitive lithographic printing plate at least comprising a substrate and a dampening water receiving layer and a photosensitive layer formed on the substrate successively wherein the above hydrophilic resin layer is used as the dampening water receiving layer; and (3) an image-adding type lithographic printing plate at least comprising a substrate and an image-receiving layer formed on the substrate wherein the above hydrophilic resin layer is used as the image-receiving layer.

Other embodiments of the present invention include:

(4) a laminated substrate as set forth in item (1), wherein the hydrophilic resin layer is one made from a resin composition comprising a phase of a hydrophobic polymer and a phase of a hydrophilic polymer having acidic groups, salts of acidic groups, basic groups or salts of basic groups which are phase-separated in micro order;

(5) a laminated substrate as set forth in item (1), wherein the hydrophobic polymer and the hydrophilic polymer are chemically bonded to form a copolymer;

(6) a laminated substrate as set forth in item (1), wherein the hydrophilic resin layer is one made from a resin composition comprising a graft- or block-copolymer composed of a hydrophobic polymer and a hydrophilic polymer;

(7) a laminated substrate as set forth in item (1), wherein the hydrophilic resin layer is one prepared by subjecting a layer made from a resin composition comprising a copolymer composed of a block of a hydrophobic polymer and a block of a hydrophilic polymer having salts of acidic groups to treatment with an acidic solution;

(8) a laminated substrate as set forth in item (1), wherein the hydrophilic resin layer is one prepared by subjecting a layer made from a resin composition comprising a copolymer composed of a block of a hydrophobic polymer and a block of a hydrophilic polymer having salts of basic groups to treatment with a basic solution;

(9) a laminated substrate as set forth in item (1), wherein the hydrophilic resin layer further contains a crosslinking agent;

(10) a laminated substrate as set forth in item (1), wherein the acidic groups are at least one kind of groups selected from the group consisting of carboxyl group, sulfonic acid group and phosphonic acid group;

(11) a laminated substrate as set forth in item (1), wherein the salts of acidic groups are at least one kind of groups selected from the group consisting of alkali metal salts, alkaline earth metal salts, ammonium salts and organic amine salts of acidic groups;

(12) a laminated substrate as set forth in item (1), wherein the basic groups are at least one kind of groups selected from the group consisting of primary, secondary, and tertiary amino groups;

(13) a laminated substrate as set forth in item (1), wherein the salts of basic groups are at least one kind of groups selected from the group consisting of hydrochlorides of primary, secondary and tertiary amino groups;

(14) a laminated substrate as set forth in item (1), wherein the hydrophilic resin layer acts as a dampening water receiving layer;

(15) a laminated substrate as set forth in item (1), wherein the hydrophilic resin layer acts as an image receiving layer;

(16) a laminated substrate as set forth in item (1), wherein the substrate is a polyester film; and

(17) a photosensitive lithographic printing plate as set forth in item (2), wherein the photosensitive layer contains a diazo resin or an ortho-naphthoquinonediazide resin.

DESCRIPTION OF THE PREFERRED EMBODIMENTS

The present invention will now be described in detail.

As described above, the laminated substrate of the present invention is one comprising a substrate and a hydrophilic resin layer formed on the substrate wherein the hydrophilic resin layer is one made from a resin composition comprising a hydrophobic polymer and a hydrophilic polymer having acidic groups, salts of acidic groups, basic groups or salts of basic groups. Although the hydrophilic resin layer may be a layer made from a resin composition comprising a block-or graft-copolymer wherein the hydrophobic polymer and the hydrophilic polymer are chemically bonded to each other or a layer made from a resin composition comprising a mixture of the hydrophobic polymer with the hydrophilic polymer, the former is preferable, because the hydrophobic polymer and the hydrophilic polymer can be phase-separated in higher micro order in the layer.

It is preferable that the hydrophilic resin layer be treated with an acidic solution when the layer contains a copolymer composed of a block of a hydrophobic polymer and a block of a hydrophilic polymer having salts of acidic groups, while the layer be treated with a basic solution when it contains a copolymer composed of a block of a hydrophobic polymer and a block of a hydrophilic polymer having salts of basic groups.

The term "hydrophilic polymer" used in this specification refers to a polymer which is soluble in or swellable with (dispersible in) water or a solution comprising water as the main component and containing an aqueous alkaline solution, aqueous acid solution, organic solvent or surfactant, and such a polymer is specifically a polymer having acidic groups, salts of acidic groups, basic groups or salts of basic groups on the main or side chains.

The acidic groups of each hydrophilic copolymer are preferably at least one kind of groups selected from the group consisting of carboxyl group, sulfonic acid group and phosphonic acid group. Examples of such a hydrophilic polymer include polyacrylic acid, polymethacrylic acid, polycinnamic acid, polysulfonated ethyl acrylamide, polyvinylphosphonic acid, polyallysulfonic acid, polyvinylsulfonic acid and polystyrenesulfonic acid. The salts of acidic groups of each hydrophilic polymer are preferably at least one kind of groups selected from the group consisting of salts of carboxyl group, sulfonic acid group and phosphonic acid group with alkali metals, alkaline earth metals, ammonium and organic amines. The organic amines includes methylamine, ethylamine and dimethylamine. Examples of such a hydrophilic polymer include polyammonium acrylate, polyammonium methacrylate, polyammonium cinnamate, ammonium salt of polysulfonated ethylacrylamide, polyammonium vinylphosphonate, polyammonium allylsulfonate, polyammonium vinylsulfonate, polyammonium styrenesulfonate, polysodium acrylate, polysodium methacrylate, polysodium cinnamate, polysodium vinylphosphonate, polysodium allylsulfonate, polysodium vinylsulfonate, polysodium styrenesulfonate, polypotassium acrylate, polypotassium methacrylate, polypotassium cinnamate, polypotassium vinylphosphonate; polypotassium allysulfonate, polypotassium vinylsulfonate, polypotassium styrenesulfonate, polymagnesium acrylate, polymagnesium methacrylate, polymagnesium cinnamate, polylithium acrylate, polylithium methacrylate and polylithium cinnamate. In particular, it is preferable from the standpoint of stability of coating fluid that the hydrophilic polymer have at least one kind of salts of acidic groups selected from the group consisting of salts of carboxyl group with alkali metals, alkaline earth metals, ammonium and organic amines. Further, it is still preferable that the hydrophilic polymer be polyammonium acrylate, polyammonium methacrylate or an alkali metal salt of polyacrylic acid or polymethacrylic acid.

Then, the hydrophilic polymer having basic groups or salts of basic groups to be used in the present invention will now be described. The basic groups of each hydrophilic polymer are preferably at least one kind of groups selected from the group consisting of primary, secondary and tertiary amino groups. Examples of such a hydrophilic polymer include polydialkylamine (meth)acrylates such as polydimethylaminoethyl acrylate, polydiethylaminoethyl acrylate, polydimethylaminoethyl methacrylate and polydiethylaminoethyl methacrylate. Preferable examples of the salts of basic groups include hydrochlorides, phosphates and sulfates of the above amino groups, among which the hydrochlorides are still preferable from the standpoint of stability of coating fluid. Such a hydrophilic polymer is specifically one having at least one kind of groups selected from the groups consisting of hydrochlorides of primary, secondary and tertiary amino groups. Examples of the hydrophilic polymer include hydrochlorides of polydialkylaminoalkyl (meth)acrylates such as hydrochloride of polydiethylaminoethyl acrylate, hydrochloride of polydiethylaminoethyl methacrylate, hydrochloride of polydimethylaminoethyl acrylate and hydrochloride of polydimethylaminoethyl methacrylate.

The term “hydrophobic polymer” used in this specification refers to a polymer which is substantially insoluble in water or an aqueous alkaline or acid solution. The hydrophobic polymer to be used in the present invention is not particularly limited but may be any hydrophobic one. Examples of the hydrophobic polymer include polyamide resins, polyester resins, polyurethane resins, polyolefin resins, (meth)acrylic resins (except carboxylated hydrophilic ones such as poly(meth)acrylic acid), epoxy resins, polystyrene resins and polybutadiene resins, among which polyamide resins are preferable owing to their excellent mechanical strengths, wear resistance and heat resistance. Examples of the polyamide resins include known nylons such as nylon 6, nylon 6, 6 and nylon 6,10; and modified polyamide resins derived therefrom, among which modified polyamide resins closslikable with the urea resins which will be described below are particularly preferable. Examples of such modified polyamide resins include hydroxymethylated polymaide resins prepared by modifying polyamide resins with formaldehyde, alkoxymethylated polyamide resins prepared by modifying polyamide resins with formaldehyde and alcohols, epoxidized polyamide resins prepared by modifying polyamide resins with epoxy compounds, and polyamide resins modified with polyamines and epichlorohydrin. Among these modified polyamide resins, self-crosslinking polyamide resins such as hydroxymethylated and alkoxymethylated ones are preferable, with methylol nylon 6 and alkoxymethyl nylon 6 being still preferable.

In the above copolymer, the weight ratio of the hydrophobic polymer to the hydrophilic polymer is desirably 95:5 to 30:70, more desirably 80:20 to 40:60, most desirably 70:30 to 50:50. When the content of the hydrophobic polymer is less than 30% by weight, the resulting hydrophilic resin layer will be poor in water resistance and therefore will be swollen during development or printing, so that printing using a plate comprising the layer will result in poor resolution. On the contrary, when the content of the hydrophobic polymer exceeds 95% by weight, a hydrophilic resin layer poor in hydrophilicity will be made by development to come to the surface in non-image areas to give prints suffering from scumming unfavorably.

When the copolymer is one prepared by grafting a hydrophilic polymer onto a hydrophobic polymer, such a graft copolymer can be prepared by the following processes, though the process of preparing the graft copolymer is not limited to them.

For example, there are known processes which comprises introducing a monomer copolymerizable with a hydrophilic monomer having an acidic group, salts of acidic group, basic group or salts of basic group to the main or side chain or end of a hydrophobic polymer and grafting the resulting hydrophobic polymer with a hydrophilic monomer. When the hydrophobic polymer is a polyamide resin and the hydrophilic monomer is ammonium (meth)acrylate, the introduction of such a copolymerizable monomer to the main chain of the hydrophobic polymer can be conducted by, e.g., a process of copolymerizing a diamine or dicarboxylic acid component having a polymerizable unsaturated bond in preparing a polyamide resin; the introduction thereof to the end can be conducted by, e.g., a process of reacting the terminal amino group of a polyamide resin with a polymerizable unsaturated monomer reactive with amino group; and the introduction thereof to the side chain can be conducted by, e.g., a process of reacting a polyamide resin having a functional group (such as carboxyl, hydroxyl or amino) with a polymerizable unsaturated monomer having a group reactive with the above functional group, for example, glycidyl acrylate, 2-hydroxyethyl acrylate and acrylic acid.

Further, there are known a process of reacting a polyamide having a functional group on the side chain directly with a poly(meth)acrylic acid having a group reactive with the functional group at the end; and a process of combining a polyamide having a functional group on the side chain with a poly(meth)acrylic acid having a functional group at the end by the use of a bifunctional coupling agent reactive with the functional groups.

Further, the block copolymer can be prepared by reacting a polyamide having a functional group at the end directly with a poly(meth)acrylic acid having a group reactive with the functional group at the end.

Although the copolymer may be used as such in the present invention, the water resistance of the hydrophilic resin layer can be enhanced by crosslinking the copolymer with a crossliking agent (hardener resin). Such a crosslinking agent includes urea resins, melamine resins, epoxy resins and acrylic resins, among which urea resins are preferable owing to their hydrophilicity. Preferable examples of the urea resins include urea-formaldehyde resins such as unmodified urea-formaldehyde resin, cationic urea-formaldehyde resins prepared by modifying urea-formaldehyde resin with at least one polyfunctional basic compound having several basic groups, nonionic urea-formaldehyde resins prepared by modifying it with at least one polyol, and anionic urea-formaldehyde resins prepared by modifying it with an acid salt of sulfurous acid. These crosslinking agents are used together with the copolymers wherein the hydrophobic polymer is a crosslinkable modified polyamide resin as described above, and serve to crosslink the copolymers.

Although the content of the urea resin may suitably be selected depending on the content ratio of the hydrophilic polymer to the hydrophilic polymer having acidic or basic groups on the side chains, the weight ratio of the copolymer to the urea resin is desirably 40:60 to 98:2, more desirably 50:50 to 95:5, most desirably 60:40 to 90:10. When the content of the urea resin is less than 2% by weight, the resulting hydrophilic resin layer will be poor in water resistance and therefore will be swollen during development subsequent to exposure and during printing, so that printing using a plate comprising the layer will result in poor resolution. On the contrary, when the content exceeds 60% by weight, the resulting hydrophilic resin layer will be poor in hydrophilicity, so that printing using a plate comprising the layer will give prints suffering from scumming unfavorably.

It is preferable that the composition constituting the hydrophilic resin layer contain a curing agent to accelerate the crosslinking of the copolymer with a urea resin and/or the self-crosslinking of the copolymer. The curing agent is not particularly limited but may be any one which can accelerate the crosslinking, and examples thereof include p-toluene-sulfonic acid, oxalic acid, various amines and hydrochlorides of various amines.

Further, it is also preferable that the composition constituting the hydrophilic resin layer contain a pigment for the purpose of improving the water retention and coating properties of the hydrophilic resin layer and the adhesion thereof to a photosensitive layer and enhancing the hydrophilicity of the hydrophilic resin layer of the developed plate. The pigment to be used in this case is preferably a known inorganic one, which may arbitrarily be selected from among titanium dioxide, silicon dioxide, aluminum oxide, zinc oxide, acid clay, clay and so on.

For the purpose of improving the flexibility of the hydrophilic resin layer, the composition constitut ng the layer may further contain polyvinyl alcohol, various modified polyvinyl alcohols, casein, modified polyacrylic acids or the like.

The thickness of the hydrophilic resin layer is preferably 0.1 to 80 μm, still preferably 5 to 50 μm. When the thickness of the hydrophilic resin layer is less than 0.1 μm, the resulting plate will be poor in wear resistance, while when it exceeds 80 μm, the resulting hydrophilic resin layer will be unfavorably poor in adhesion to a substrate.

The substrate to be used in producing the laminated substrate of the present invention includes metallic ones made of aluminum and iron; non-metallic ones such as polyester film, polyethylene film, polypropylene film, papers laminated with polyolefins such as polyethylene, polycarbonate film and polystyrene film; and laminates comprising non-metallic materials and metallic ones. Non-metallic substrates are preferable, because they are inexpensive and flexible. The thickness of the substrate is 0.01 to 1 mm, preferably 0.1 to 0.3 mm, still preferably 0.15 to 0.24 mm. Although the thickness of the laminated substrate of the present invention may vary depending on the field to which the substrate is applied, it is 10.1 to 1080 μm, preferably100 to 380 μm, still preferably 160 to 290 μm.

Then, description will now be made on the photosensitive lithographic printing plate of the present invention at least comprising a substrate and a dampening water receiving layer and a photosensitive layer formed on the substrate successively wherein the above hydrophilic resin layer is used as the dampening water receiving layer. The photosensitive layer constituting the printing plate may be made of any photosensitive material usable for ordinary PS plates. There have been known negative photosensitive materials and positive ones. Examples of the negative photosensitive materials include photosetting diazo resins, photodimerizable polyvinyl cinnamate resins, and photopolymerizable resins, while those of the positive photosensitive materials include photosolubilizable ortho-naphthoquinonediazide resins.

When the dampening water receiving layer is made from a resin composition comprising a phase of a hydrophobic polymer and a phase of a hydrophilic polymer having acidic groups which are phase-separated in micro order, it is preferable in order to conduct simultaneously development and formation of a hydrophilic surface in non-image areas that the photosensitive layer be an alkali-developable one. When the photosensitive layer is not of alkali-developable type, the formation of a hydrophilic surface in non-image areas can be conducted by dipping the developed plate wherein the dampening water receiving layer comes to the surface in non-image area in an aqueous alkaline solution. Alternatively, the formation may be conducted by using an alkaline dampening water in printing without dipping the plate in an aqueous alkaline solution.

When the dampening water receiving layer -s made from a resin composition comprising a phase of a hydrophobic polymer and a phase of a hydrophilic polymer having basic groups which are phase-separated in micro order, it is preferable in order to conduct simultaneously development and formation of a hydrophilic surface in non-image areas that the photosensitive layer be an acid-developable one. When the photosensitive layer is not of acid-developable type, the formation of a hydrophilic surface in non-image areas can be conducted by dipping the developed plate wherein the dampening water receiving layer comes to the surface in non-image areas in an aqueous acidic solution. Alternatively, the formation may be conducted by using an acidic dampening water in printing without dipping the plate in an aqueous acidic solution.

The photosensitive lithographic printing plate of the present invention may further contain an adhesive layer between the substrate and the dampening water receiving layer. The adhesive to be used in this layer is a polyester resin or the like.

The photosensitive lithographic printing plate of the present invention may further have on the photosensitive layer a protective layer made of a polymer excellent in oxygen barrier properties, e.g., polyvinyl alcohol or polyethylene terephthalate, for the purpose of protecting the polymerization of the photosensitive layer from hindrance caused by atmospheric oxygen.

The photosensitive lithographic printing plate of the present invention can be produced, e.g., as follows. First, a coating fluid is prepared by dispersing in a solvent a composition comprising a copolymer composed of a block of a hydrophobic polymer and a block of a hydrophilic polymer having acidic groups, salts of acidic groups, basic groups or salts of basic groups and, if necessary, a urea resin, a curing agent and/or a pigment. Although the solvent to be used in this case may be one inert to the copolymer and the urea resin, it is preferable in solubility of the copolymer or the urea resin to use an aqueous solvent such as water or an alcohol. The dispersion thus prepared is applied on a substrate, followed by drying. In the layer thus formed, a phase of a hydrophobic polymer and a phase of a hydrophilic polymer are phase-separated in micro order. Further, salts of acidic or basic groups are present at high density in the hydrophilic polymer phase near the surface of the layer, so that the layer exhibits hydrophilicity.

When the above copolymer contains a crosslinkable modified polyamide as described above or when the above composition contains a urea resin crosslinking such a modified polyamide, the laminate prepared above is further subjected to heat treatment to conduct the crosslinking of the copolymer with the urea resin and/or the self-crosslinking of the copolymer. Although the temperature and time of this heat treatment may suitably be selected depending on the kinds of the crosslinking and the heater used, it is preferable that the heat treatment be conducted at 90 to 150° C. for 3 to 10 minutes.

When a copolymer composed of a block of a hydrophobic polymer and a block of a hydrophilic polymer having salts of acidic groups is used, the resulting layer is then treated with an acidic solution. In this treatment, at least the salts of acidic groups present on the surface of the dampening water receiving layer are converted into free acidic groups, by which the hydrophobic polymer and the hydrophilic polymer are phase-separated in micro order to thereby make at least the surface of the dampening water receiving layer hydrophobic. Although the kind, concentration and temperature of the acidic solution may be selected depending on the kind of the counter anion, for example, hydrochloric acid and nitric acid are favorably usable. When the salts of acidic groups of the hydrophilic polymer constituting the copolymer are ammonium salts, the ammonium salts are decomposed into free acidic groups by the above heat treatment with the generation of ammonia, so that the treatment with an acidic solution can be dispensed with.

When a copolymer composed of a block of a hydrophobic polymer and a block of a hydrophilic polymer having salts of basic groups is used, the resulting layer is then treated with an alkaline solution. In this treatment, at least the salts of basic groups present on the surface of the dampening water receiving layer are converted into free basic groups, by which the hydrophobic polymer and the hydrophilic polymer are phase-separated in micro order to thereby make at least the surface of the dampening water receiving layer hydrophobic. Although the kind, concentration and temperature of the alkaline solution may be selected depending on the kinds of the counter cation and the basic groups, for example, an aqueous solution of sodium hydroxide and an aqueous solution of sodium silicate are favorably usable. When the salts of basic groups of the hydrophilic polymer constituting the copolymer are hydrochlorides, the hydrochlorides are decomposed into free basic groups by the above heat treatment with the generation of hydrochloric acid, so that the treatment with an alkali can be dispensed with.

Then, a coating fluid for forming a photosensitive layer is prepared, applied on the dampening water receiving layer and dried to form a photosensitive layer. Finally, a coating fluid for a protective layer is prepared, applied on the photosensitive layer and dried to form a protective layer. Thus, a photosensitive lithographic printing plate according to the present invention can be produced.

A lithographic form plate can be produced by subjecting the photosensitive lithographic printing plate produced above to exposure, development and alkali or acid treatment successively. The exposure is conducted by the use of argon ion laser, mercury vapor lamp, chemical lamp, carbon arc lamp, xenon lamp or the like. Further, the development is conducted by dipping the resulting plate in a developing solution, by which non-image areas are rid of the photosensitive layer to make the dampening water receiving layer come to the surface. Although the developing solution is suitably selected depending on the kind of photosensitive material used, the use of a negative photosensitive material leads to the use of a negative developing solution, while the use of a positive photosensitive material leads to the use of a positive one. When a copolymer composed of a block of a hydrophobic polymer and a block of a hydrophilic polymer having acidic groups is used and the development is conducted by using a non- alkaline developing solution, the resulting developed plate is dipped in an aqueous alkaline solution. On the contrary, when a copolymer composed of a block of a hydrophobic polymer and a block of a hydrophilic polymer having basic groups is used and the development is conducted by using a non-acid developing solution, the resulting developed plate is dipped in an aqueous acid solution. In non-image areas wherein the photosensitive material is not cured, at least acidic or basic groups present on the surface of the dampening water receiving layer are converted into salts of acidic or basic groups by the above dipping to make the surface of the dampening water receiving layer hydrophilic.

The present invention also provides an image-adding type lithographic printing plate at least comprising a substrate and an image-receiving layer formed on the substrate wherein the above hydrophilic resin layer is used as the image-receiving layer. A lithographic form plate can be produced only by forming an image on the image-receiving layer with an oil-based ink or toner. The image-receiving layer has a hydrophobic surface, so that the adhesion of an image layer to the image-receiving layer is excellent. Then, the resulting printing plate is subjected to alkaline treatment, when the plate is produced by using a copolymer composed of a block of a hydrophilic polymer and a block of a hydrophilic polymer having acidic groups, while it is subjected to acid treatment, when the plate is produced by using a copolymer composed of a block of a hydrophilic polymer and a block of a hydrophilic polymer having basic groups. In non-image areas, at least the acidic or basic groups present on the surface of the image-receiving layer are converted into salts of acidic or basic groups by such treatment to give a hydrophilic surface, while in image areas, the image-receiving layer remains even after the above treatment to give a hydrophobic surface. When printing is conducted by using the form plate thus produced, a lipophilic ink is received in the hydrophobic image areas, but is repelled in the hydrophilic non-image areas, while water is received in the non-image areas. Thus, the image-adding type lithographic printing plate of the present invention is usable for printing using a lithographic press to give prints. Examples of the solution to be used in the above alkaline treatment include aqueous solutions of sodium silicate, aqueous solutions of sodium hydroxide and commercially available developing solutions for alkali development, while those of the solution to be used in the above acid treatment include hydrochloric acid, nitric acid and commercially available developing solutions for acid development.

When an image is formed by electrophotography with toner, an dielectric material can be added to the image-receiving layer, the interlayer and/or the back coat in such a way as to adjust the volume resistivity of the printing plate to $10^{10}$ to $10^{12}\Omega\cdot cm^2$, for the purpose of inhibiting more completely the scumming of the image-adding type lithographic printing plate. The dielectric material may be any of inorganic and organic ones. Examples of the inorganic dielectric materials include salts of mono- and polyvalent metals such as Na, K, Li, Mg, Zn, Co and Ni, while those of the organic dielectric materials include polymeric cationic conductive materials such as polyvinylbenzyltrimethylammonium chloride and quaternary ammonium salts derived from acrylic resins; and polymeric anionic ones such as polymeric phosphonic acids.

Explanation will now be made on the functions of the present invention having the above-mentioned constitution, though it is not conclusive but analogical.

In the copolymer to be used in forming the hydrophilic resin layer according to the present invention, it is preferable that the hydrophobic polymer and the hydrophilic polymer aggregate each separately and be phase-separated in micro order. In the layer made from a composition comprising such a preferable copolymer, a phase of the hydrophilic polymer and a phase of the hydrophobic polymer are present in a state phase-separated in micro order. Further, salts of acidic or basic groups are present at a high density in the hydrophilic polymer phase near the surface of the hydrophilic resin layer, which may make the surface of the layer hydrophilic Further, when the copolymer contains a crosslinkable modified polyamide as the hydrophobic polymer or when the above composition contains a urea resin crosslinking this modified polyamide, the crosslinking of the copolymer with the urea resin and/or the self-crosslinking of the copolymer is attained by subjecting the resulting layer to heat treatment, which may further improve the water resistance of the hydrophilic resin layer.

Furthermore, when a copolymer composed of a block of a hydrophobic polymer and a block of a hydrophilic polymer having acidic groups is used, the formed hydrophilic resin layer is subjected to acid treatment, while when a copolymer of a block of a hydrophobic polymer and a block of a hydrophilic polymer having basic groups is used, it is subjected to alkaline treatment. In such treatment, at least the salts of acidic or basic groups of the hydrophilic polymer phase present on the surface of the hydrophilic resin layer are converted into free acidic or basic groups respectively to make the hydrophilic polymer phase hydrophobic, which leads to the formation of a hydrophilic resin layer wherein a phase of the hydrophobic polymer and a phase of the polymer having acidic or basic groups on the side chains are phase-separated in micro order. When the hydrophilic resin layer thus treated is used as a dampening water receiving layer and a photosensitive layer is formed thereon, the adhesion between the dampening water receiving layer and the photosensitive layer is excellent owing to the hydrophobic surface of the former. The plate thus produced is subjected to imagewise exposure, development and so on, by which the photosensitive layer in non-image areas is swollen with a developing solution and removed to make the dampening water receiving layer come to the surface. Then, the resulting plate is subjected to alkali or acid treatment. In non-image areas, at least the acidic or basic groups present on the surface are converted into salts of acidic or basic groups by this treatment to make the dampening water receiving layer hydrophilic, while in image areas, the hydrophobic photosensitive layer remains. When printing is conducted by using the form plate thus produced, a lipophilic ink is received in the image areas owing to the hydrophobicity, but is repelled in the non-image areas, while water is received in the non-image areas owing to the hydrophilicity. Thus, prints free from scumming are obtained. Further, the adhesion between the image layer and the dampening water receiving layer is excellent, which prevents image missing which generally occurs after development or in printing. Furthermore, the water resistance of the dampening water receiving layer is excellent, so that the dampening water receiving layer in non-image areas can be inhibited from swell with dampening water, which may lead to the formation of good prints having high resolution and little suffering from scumming.

The present invention will now be described specifically by referring to the following Examples. In the Examples, all parts are by weight unless otherwise noted. The prints obtained by using form plates produced in the Examples were evaluated for resolution and scumming by the following methods:

(1) Resolution:

The resolution was determined by using a UGRA plate control and a wedge (PCW82) 1982.

(2) Scumming:

The scumming was evaluated by determining the reflection density of non-image area of each print.

EXAMPLE 1

A voided and biaxially oriented polyethylene terephthalate film having a thickness of 188 $\mu$m (a product of Toyobo Co., Ltd., CRISPER) was used as a substrate.

First, a coating fluid for dampening water receiving layer was prepared according to the following formulation:

(Composition of the coating fluid for dampening water receiving layer)

Polyammonium acrylate-grafted methoxymethylated polyamide resin (Toresin FS350, a product of Teikoku Chemical Industry Co., Ltd., solid content: 20%, extent of grafting: 30%): 100 parts Urea resin (U-RAMIN P1500, a product of Mitsui Toatsu Chemicals, Inc., solid content: 40%): 5 parts p-Toluenesulfonic acid: 0.2 part Titanium oxide (anatase): 300 parts Water: 30 parts The above coating fluid for dampening water receiving layer was applied on the substrate by the use of a reverse-roll coater and dried at 120° C. for 5 minutes. The coating weight of the formed layer was 8 g/m$^2$. The resulting laminate was dipped in 15% hydrochloric acid for 5 minutes, washed with water and then dried at 90° C. for 5 minutes.

Then, a coating fluid for photosensitive layer was prepared according to the following formulation:

(Composition of the coating fluid for photosensitive layer)

Negative photosensitive solution (sun wipe-on photosensitive solution, New Type A): 100 parts Negative photosensitive solution (sun wipe-on photosensitive solution, New Type B): 4 parts The above coating fluid for photosensitive layer was applied on the dampening water receiving layer in a coating weight of 2 g/m$^2$ by the use of a reverse-roll coater and dried at 90° C. for 2 minutes to give a test piece.

This test piece was subjected to imagewise exposure with a super-high pressure mercury lamp (a room-light printer mfd. by Orc Co., Ltd.), dipped in a 1/3 dilution (30° C.) of a negative developer (a product of Fuji Photo Film Co., Ltd., DN-3C) for PS plates for 30 seconds, and then washed with water to remove uncured portion of the photosensitive layer. Then, the resulting test piece was dipped in a 1/30 dilution (30° C.) of a positive developer (a product of Fuji Photo Film Co., Ltd., DP-4) for PS plates for 30 seconds and dried with air to give a lithographic form plate.

EXAMPLES 2 to 6

A dampening water receiving layer was formed on a voided and biaxially oriented polyethylene terephthalate film having a thickness of 188 $\mu$m (a product of Toyobo Co., Ltd., CRISPER) in the same manner as that of Example 1 except that the ratio of the copolymer to the urea resin was changed to one specified in Table 1. Further, the formation of a photosensitive layer thereon and the exposure and development of the resulting test piece were conduced in similar manners to those of Example 1. Thus, lithographic form plates were produced.

EXAMPLES 7 to 11

Test pieces were prepared by using a voided and biaxially oriented polyethylene terephthalate film having a thickness of 188 $\mu$m (a product of Toyobo Co., Ltd., CRISPER) as a substrate in the same manner as that of Example 1 except that the copolymers listed in Table 2 were used instead of the polyammonuim acrylate-grafted methoxymethylated polyamide resin. The obtained test pieces were subjected to exposure and development in similar manners to those of Example 1 to give lithographic form plates.

EXAMPLE 12

A coating fluid for photosensitive layer having the following composition was applied on a dampening water receiving layer formed in the same manner as that of Example 1, and dried with hot air to form a coat having a thickness of 1.8 g/m$^2$.

(Composition of the coating fluid for photosensitive layer)

Poly (methylmethacrylate/methacrylicacid) (moleratio: 85/15, M.W.: 80,000): 52 parts Tetraethylene glycol diacrylate: 40 parts 2,2'-(o-Chlorophenyl)-4,4',5,5'-tetraphenylbisimidazole: 5 parts Michler's ketone: 3 parts Methanol: 200 parts Ethyl acetate: 80 parts Chloroform: 120 parts The above coating fluid for photosensitive layer was applied on the dampening water receiving layer by the use of a reverse-roll coated in a coating weight of 2 g/m$^2$ and dried at 90° C. for 2 minutes.

Then, a coating fluid for protective layer having the following composition was applied on the photosensitive layer and dried with hot air dryer at 100° C. for one minute to form a protective layer having a thickness of 1 g/m$^2$. Thus, a test piece was produced.

(Composition of the coating fluid for protective layer)

Polyvinyl alcohol (completely saponified one, degree of polymerization: 500): 100 parts Nonionic surfactant (Noigen EA150, a product of Dai-ichi Kogyo Seiyaku Co., Ltd.): 1 part Water: 900 parts The above test piece was subjected to imagewise exposure with a super-high pressure mercury lamp (a room-light printer mfd. by Orc Co. Ltd.), dipped in a 1/3 dilution (30° C.) of a negative developer (a product of Fuji Photo Film Co., Ltd., DN-3C) for PS plates for 30 seconds, and then washed with water to remove uncured portion of the photosensitive layer. Then, the resulting test piece was dipped in a 1/30 dilution (30° C.) of a positive developer (a product of Fuji Photo Film Co., Ltd., DP-4) for PS plates for 30 seconds and dried with air to give a lithographic form plate.

EXAMPLE 13

A coating fluid for photosensitive layer having the following composition was applied on a dampening water receiving layer formed in the same manner as that of Example 1, and dried with hot air to form a coat having a thickness of 1.8 g/m$^2$.

(Composition of the coating fluid for photosensitive layer)

Poly(ethyl methacrylate/methacrylic acid/n-hexyl methacrylate) (mole ratio: 65/15/20): 52 parts Tetraethylene glycol diacrylate: 40 parts ($\eta^5$-Cyclopentadienyl)(,$\eta^6$-toluene)iron (II) hexafluorophosphate: 5 parts 7-Diethylamino-3-(2-benzimidazolyl)cumarin: 3 parts N-Phenylglycine: 6 parts Methyl ethyl ketone: 150 parts Dimethylformamide: 150 parts Then, the same coating fluid for protective layer as that used in Example 12 was applied and dried with hot air at 100° C. for one minute to form a protective layer having a thickness of 1.2 g/m$^2$. Thus, a test piece was produced.

The obtained test piece was subjected to imagewise scanning exposure with argon ion laser (50 mW, beam diameter: 25$\mu$). The resulting test piece was dipped in the same developing solution as that used in Example 1 at 30° C. for 23 seconds and washed with water to remove uncured portion of the photosensitive layer. Then, the resulting piece was dipped in a 1/30 dilution (30° C.) of a positive developer (a product of Fuji Photo Film Co., Ltd., DP-4) for PS plates for 30 seconds and dried with air to give a lithographic form plate.

The lithographic form plates produced in Examples 1 to 13 were subjected to printing by a press 3200 MCD (mfd. by Ryobi Ltd.) with a commercially available ink on wood-free paper to evaluate the durability of the form plate and the scumming and resolution of print. The results are given in Tables 1 to 3.

TABLE 1

| | Copolymer (parts) | Urea resin (parts) | Copolymer/ Urea resin | Resolution ($\mu$m) | Scumming | Durability |
|---|---|---|---|---|---|---|
| Example 1 | 100 | 5 | 90/10 | 4 | not observed | 30000 or above |
| Example 2 | 108 | 1.1 | 98/2 | 6 | not observed | 30000 or above |
| Example 3 | 105 | 2.8 | 95/2 | 4 | not observed | 30000 or above |
| Example 4 | 94 | 8 | 85/15 | 4 | not observed | 30000 or above |
| Example 5 | 88 | 11 | 80/20 | 4 | not observed | 30000 or above |
| Example 6 | 83 | 17 | 71/29 | 4 | not observed | 30000 or above |

TABLE 2

| | Graft polymer | Resolution ($\mu$m) | Scumming | Durability |
|---|---|---|---|---|
| Example 7 | Polyammonium acrylate grafted methoxymethylated polyamide resin (solid content: 20%, extent of grafting: 50%) | 4 | not observed | 30000 or above |

TABLE 2-continued

| | Graft polymer | Resolution (μm) | Scumming | Durability |
|---|---|---|---|---|
| Example 8 | Polypotassium acrylate grafted methoxymethylated polyamide resin (solid content: 20%, extent of grafting: 50%) | 4 | not observed | 30000 or above |
| Example 9 | Polyacrylic acid grafted methoxymethylated polyamide resin (solid content: 20%, extent of grafting: 20%) | 4 | not observed | 30000 or above |
| Example 10 | Polysodium allylsulfonate grafted methoxymethylated polyamide resin (solid content: 20%, extent of grafting: 20%) | 4 | not observed | 30000 or above |
| Example 11 | Polyammonium allylsulfonate grafted methoxymethylated polyamide resin (solid content: 20%, extent of grafting: 30%) | 4 | not obsereved | 30000 or above |

TABLE 3

| | Co-poly-mer | Urea resin | Co-polymer/ Urea resin | Resolution (μm) | Scumming | Durability |
|---|---|---|---|---|---|---|
| Example 12 | 100 | 5 | 90/10 | 4 | not observed | 30000 or above |
| Example 13 | 100 | 5 | 90/10 | 4 | not observed | 30000 or above |

It can be understood from the results given in Tables 1 to 3 that when printing is conducted by using the lithographic form plates produced in Examples 1 to 13, the plates are excellent in durability and the obtained prints are free from scumming and exhibit high resolution.

EXAMPLE 14

Images were formed on an image-adding type lithographic printing plate wherein the same layer as that used in Example 1 as a dampening water receiving layer was used as an image receiving layer by the use of a commercially available PPC. The resulting plate was dipped in a 1/30 dilution (30° C.) of a positive alkali developer (a product of Fuji Photo Film Co., Ltd., DP-4) for PS plates for 30 seconds, washed with water and dried with air to give a lithographic form plate. This plate was subjected to printing by a press 3200 MCD (mfd. by Ryobi Ltd.) with a commercially available ink on wood-free paper to evaluate the durability of the form plate and the scumming of print. Good prints free from scumming were obtained and the durability was 10,000 or above.

EXAMPLE 15

Images were drawn directly on an image-adding type lithographic printing plate wherein the same layer as that used in Example 1 as a dampening water receiving layer was used as an image receiving layer by the use of a commercially available felt-tipped oily pen. The resulting plate was dipped in a 1/30 dilution (30° C.) of a positive alkali developer (a product of Fuji Photo Film Co., Ltd., DP-4) for PS plates for 30 seconds, washed with water and dried with air to give a lithographic form plate. This plate was subjected to printing by a press 3200 MCD (mfd. by Ryobi Ltd.) with a commercially available ink on wood-free paper to evaluate the durability of the form plate and the scumming of print. Good prints free from scumming were obtained and the durability was 10,000 or above.

As apparent from the above description, the present invention can provide a photosensitive lithographic printing plate having a dampening water receiving layer which is excellent in the adhesion to a photosensitive layer and in the hydrophiliciy and water resistance in non-image areas after development, so that printing using such a plate is excellent in durability and does not suffer from scumming or image missing to give good prints having high resolution. Further, this dampening water receiving layer can be used also as the image-receiving layer of an image-adding type lithographic printing plate, and printing using an image-adding type lithographic printing plate comprising such a layer gives good prints free from scumming. Thus, the present invention contributes greatly to the industrial world.

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate comprising a substrate, a dampening water receiving layer and a photosensitive layer formed on the substrate successively, wherein the dampening water receiving layer is made from a resin composition containing a cross-linking agent and a copolymer in which a hydrophobic polymer phase is chemically bonded to a hydrophilic polymer phase having acidic groups, salts of acidic groups, basic groups, or salts of basic groups.

2. A photosensitive lithographic printing plate according to claim 1, wherein the photosensitive layer contains a diazo resin or an orthonaphthoquinone diazide resin.

3. A photosensitive lithographic printing plate according to claim 1, wherein the copolymer is made from a copolymer comprising a hydrophobic polymer phase and a hydrophilic polymer phase having acidic groups, salts of acidic groups, basic groups, or salts of basic groups which are phase-separated in micro order.

4. A photosensitive lithographic printing plate according to claim 1, wherein the copolymer is a graft copolymer or a block copolymer composed of a hydrophobic polymer and a hydrophilic polymer.

5. A photosensitive lithographic printing plate according to claim 1, wherein the dampening water receiving layer is a layer prepared by subjecting a layer made from a resin composition comprising a copolymer of a block of a hydrophobic polymer and a block of a hydrophilic polymer having salts of acidic groups, to a treatment with an acidic solution.

6. A photosensitive lithographic printing according to claim 1, wherein the dampening water receiving layer is a layer prepared by subjecting a layer made from a resin composition comprising a copolymer of a block of a hydrophobic polymer and a block of a hydrophilic polymer having salts of basic groups, to a treatment with a basic solution.

7. A photosensitive lithographic plate according to claim 1, wherein the acidic groups are used and are at least one kind of groups selected from the group consisting of carboxylic acid, sulfonic acid, and phosphonic acid.

8. A photosensitive lithographic printing according to claim 1, wherein the salts of acidic groups are used and are at least one kind of groups selected from the group consisting of alkali metal salts, alkaline earth metal salts, ammonium salts, and organic amine salts.

9. A photosensitive lithographic printing according to claim 1, wherein the basic groups are used and are at least one kind of groups selected from the group consisting of primary, secondary, and tertiary amino groups.

10. A photosensitive lithographic printing according to claim 1, wherein the salts of basic groups are used and are at least one kind of groups selected from the group consisting of hydrochlorides of primary, secondary and tertiary amino groups.

11. A photosensitive lithographic printing according to claim 1, wherein the substrate is a polyester film.

12. A photosensitive lithographic printing plate according to claim 1, wherein the weight ratio of the hydrophobic polymer to the hydrophilic polymer is 95:5 to 30:70, the thickness of the dampening water receiving layer is 0.1 to 80 $\mu$m, and wherein the thickness of the substrate is 10.1 to 1080 $\mu$m.

* * * * *

UNITED STATES PATENT AND TRADEMARK OFFICE
CERTIFICATE OF CORRECTION

PATENT NO. : 5,914,211

DATED : June 22,1999

INVENTOR(S) : Tadashi HASHINO et al.

It is certified that error appears in the above-identified patent and that said Letters Patent is hereby corrected as shown below:

On the title page, Item [22] PCT filed, "November 26,1997" should read --November 26, 1996--.

Signed and Sealed this

Second Day of May, 2000

*Attest:*

Q. TODD DICKINSON

*Attesting Officer*

*Director of Patents and Trademarks*